US012701860B2

(12) United States Patent
Liu et al.

(10) Patent No.: US 12,701,860 B2
(45) Date of Patent: Aug. 4, 2026

(54) DISPLAY SUBSTRATE AND DISPLAY DEVICE

(71) Applicant: BOE TECHNOLOGY GROUP CO., LTD., Beijing (CN)

(72) Inventors: Wei Liu, Beijing (CN); Meng Zhao, Beijing (CN); Cheng Xu, Beijing (CN); Dandan Zhou, Beijing (CN); Renquan Gu, Beijing (CN); Jianhua Du, Beijing (CN); Chaolu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 588 days.

(21) Appl. No.: 18/031,651

(22) PCT Filed: Jun. 29, 2022

(86) PCT No.: PCT/CN2022/102170
§ 371 (c)(1),
(2) Date: Apr. 13, 2023

(87) PCT Pub. No.: WO2024/000219
PCT Pub. Date: Jan. 4, 2024

(65) Prior Publication Data
US 2024/0373674 A1 Nov. 7, 2024

(51) Int. Cl.
H10K 59/121 (2023.01)
H10K 59/131 (2023.01)

(52) U.S. Cl.
CPC ....... H10K 59/1213 (2023.02); H10K 59/131 (2023.02)

(58) Field of Classification Search
CPC ............. H10K 59/1213; H10K 59/131; H10K 59/1216; H10K 50/00; H10K 59/123
See application file for complete search history.

(56) References Cited

U.S. PATENT DOCUMENTS

2021/0249491 A1* 8/2021 Kim ..................... H10K 59/131
2022/0077262 A1 3/2022 Shin et al.
2022/0173184 A1* 6/2022 Jeong ................... H10D 86/451

FOREIGN PATENT DOCUMENTS

CN 109697958 A 4/2019
CN 110610684 A 12/2019
(Continued)

*Primary Examiner* — Steven B Gauthier
*Assistant Examiner* — Alvin L Lee
(74) *Attorney, Agent, or Firm* — HOUTTEMAN LAW LLC

(57) ABSTRACT

Provided are a display substrate and a display device. The display substrate includes a base substrate and pixel units each including a pixel driving circuit at least including a first and a second thin film transistors; a first semiconductor layer, a first conductive layer, a second conductive layer and a second semiconductor layer are sequentially arranged on the base substrate; the first semiconductor layer includes a first active layer, including a first source region, of the first thin film transistor; the first conductive layer includes a first gate of the first thin film transistor; the second conductive layer includes a first transfer electrode electrically connected to the first source region; the second semiconductor layer includes a second active layer, which includes a second source region, of the second thin film transistor; the second source region is electrically connected to the first transfer electrode.

16 Claims, 4 Drawing Sheets

(56)     References Cited

FOREIGN PATENT DOCUMENTS

| CN | 112420618 | A | * | 2/2021 | ........... | H10D 64/665 |
|----|-----------|---|---|--------|------------|--------------|
| CN | 113257873 | A |   | 8/2021 | | |
| CN | 113299747 | A |   | 8/2021 | | |
| CN | 113972223 | A |   | 1/2022 | | |

* cited by examiner

DISPLAY SUBSTRATE AND DISPLAY DEVICE

TECHNICAL FIELD

The present disclosure relates to the field of display technology, and particularly relates to a display substrate and a display device.

BACKGROUND

With the continuous maturation of Low-Temperature Polycrystalline Oxide (LTPO) technology, further optimization and development of LTPO backplane technology have been developed deeply, to further improve the resolution in the related art, and break through a current situation that a pixel density (i.e., Pixels Per Inch, PPI) cannot be improved due to the limited process capability of the device.

At present, there are many technical solutions that use staked thin film transistors (TFTs) for design and development, but a biggest problem of using the stacked TFTs for manufacturing is in via hole overlapping, and the design and process of the via hole overlapping directly determine whether the stacked TFTs can really greatly improve the PPI in the related art. Generally, in a semiconductor device, a source metal and a drain metal downwardly overlap a semiconductor layer through via holes to form a TFT device. In principle, such overlapping has a small contact resistance and will not have a large impact on turned-on or an on-state current of the TFT. However, in such a design, multiple times of punching are adopted in the overall process of manufacturing the stacked TFTs, and almost all the layer structures are to be punched, which has a great influence on improving the PPI and reducing the process steps and the cost. Further, a directly downward overlapping using the semiconductor is adopted to realize an electrical connection, but in the process of overlapping, deep via holes are formed in some areas, which seriously affects the yield of overlapping.

SUMMARY

The present disclosure is directed to at least one of the problems in the related art, and provides a display substrate and a display device.

In a first aspect, an embodiment of the present disclosure provides a display substrate, including a base substrate and a plurality of pixel units disposed on the base substrate, each pixel unit includes a pixel driving circuit, and the pixel driving circuit at least includes a first thin film transistor and a second thin film transistor;

the display substrate further includes a first semiconductor layer, a first conductive layer, a second conductive layer and a second semiconductor layer sequentially arranged on the base substrate, where the first semiconductor layer includes a first active layer of the first thin film transistor, the first active layer including a first source region, a first drain region and a first channel region sandwiched between the first source region and the first drain region;

the first conductive layer includes a first gate of the first thin film transistor;

the second conductive layer includes a first transfer electrode which is electrically connected with the first source region through a first connecting via hole; and the second semiconductor layer includes a second active layer of the second thin film transistor, the second active layer including a second source region, a second drain region and a second channel region sandwiched between the second source region and the second drain region, and the second source region being electrically connected with the first transfer electrode through a second connecting via hole.

In some implementations, the pixel driving circuit further includes a third thin film transistor and a fourth thin film transistor, the first semiconductor layer further includes a third active layer of the third thin film transistor, the third active layer including a third source region, a third drain region and a third channel region sandwiched between the third source region and the third drain region;

the second conductive layer further includes a second transfer electrode, which is electrically connected with the third drain region through a third connecting via hole;

the second semiconductor layer further includes a fourth active layer of the fourth thin film transistor, the fourth active layer including a fourth source region, a fourth drain region and a fourth channel region sandwiched between the fourth source region and the fourth drain region, and the fourth drain region being electrically connected to the second transfer electrode through a fourth connecting via hole.

In some implementations, the second drain region is electrically connected to the second transfer electrode through a fifth connecting via hole.

In some implementations, orthographic projection of the third active layer and the fourth active layer on the base substrate are at least partially overlapped.

In some implementations, the display substrate further includes a third conductive layer located on a side of the second semiconductor layer away from the base substrate, where the third conductive layer includes a fourth gate of the fourth thin film transistor and a second gate of the second thin film transistor.

In some implementations, the pixel driving circuit further includes a fifth thin film transistor and a sixth thin film transistor;

the display substrate further includes a third semiconductor layer between the first conductive layer and the second conductive layer;

the first semiconductor layer further includes a sixth active layer of the sixth thin film transistor, the sixth active layer including a sixth source region, a sixth drain region and a sixth channel region sandwiched between the sixth source region and the sixth drain region;

the third semiconductor layer includes a fifth active layer of the fifth thin film transistor; the fifth active layer including a fifth source region, a fifth drain region and a fifth channel region sandwiched between the fifth source region and the sixth drain region, and the fifth drain region being electrically connected to the sixth drain region through a sixth connecting via hole.

In some implementations, the second conductive layer further includes a fifth gate of the fifth thin film transistor; and the first conductive layer further includes a sixth gate of the sixth thin film transistor, and orthographic projections of the fifth gate and the sixth gate on the base substrate are at least partially overlapped.

In some implementations, the second conductive layer further includes a first light-shielding pattern, and an orthographic projection of the first light-shielding pattern on the base substrate covers an orthographic projection of the second channel region on the base substrate.

In some implementations, the first light-shielding pattern and the first transfer electrode are connected into one piece.

In some implementations, the pixel driving circuit further includes a storage capacitor, and the first conductive layer further includes a first electrode plate of the storage capacitor, and the first electrode plate being electrically connected to a third gate of the third thin film transistor.

In some implementations, the display substrate further includes a fourth conductive layer between the first conductive layer and the third semiconductor layer, the fourth conductive layer including a second electrode plate of the storage capacitor and a first power signal terminal, and the first power signal terminal being electrically connected to the sixth source region of the sixth thin film transistor through a seventh connecting via hole.

In some implementations, the display substrate further includes a fifth conductive layer between the second semiconductor layer and the second conductive layer, the fifth conductive layer including a data line, and the data line being electrically connected to the fifth source region of the fifth thin film transistor through an eighth connecting via hole.

In some implementations, orthographic projections of the seventh connecting via hole and the eighth connecting via hole on the base substrate are at least partially overlapped.

In some implementations, the pixel unit further includes a light emitting device, the display substrate further includes a sixth conductive layer located on a side of the second semiconductor layer away from the base substrate, the sixth conductive layer including a first electrode of the light emitting device, the second conductive layer further includes a third transfer electrode, the first electrode is electrically connected to the third transfer electrode through a ninth connecting via hole, and the third transfer electrode is electrically connected to the first drain region of the first thin film transistor through a tenth connecting via hole.

In some implementations, the display substrate further includes a seventh conductive layer between the second semiconductor layer and the sixth conductive layer, the seventh conductive layer including an initialization signal line electrically connected to the fourth source region of the fourth thin film transistor through an eleventh connecting via hole.

In a second aspect, an embodiment of the present disclosure provides a display device, which includes the display substrate described above.

DETAIL DESCRIPTION OF EMBODIMENTS

In order that those skilled in the art will better understand the technical solutions of the present disclosure, the following detailed description is given with reference to the accompanying drawings and the specific embodiments.

Unless defined otherwise, technical or scientific terms used herein shall have the ordinary meaning as understood by one of ordinary skill in the art to which this disclosure belongs. The use of "first," "second," and the like in this disclosure is not intended to indicate any order, quantity, or importance, but rather is used to distinguish one element from another. Also, the use of the terms "a," "an," or "the" and similar referents does not denote a limitation of quantity, but rather denotes the presence of at least one. The word "comprising/including" or "comprises/includes", and the like, means that the element or item preceding the word contains the element or item listed after the word and its equivalent, but does not exclude other elements or items. The terms "connected" or "coupled" and the like are not restricted to physical or mechanical connections, but may include electrical connections, whether direct or indirect. Terms "upper/on", "lower/below", "left", "right", and the like are used only to indicate relative positional relationships, and when an absolute position of an object being described is changed, the relative positional relationships may be changed accordingly.

Figure 1:
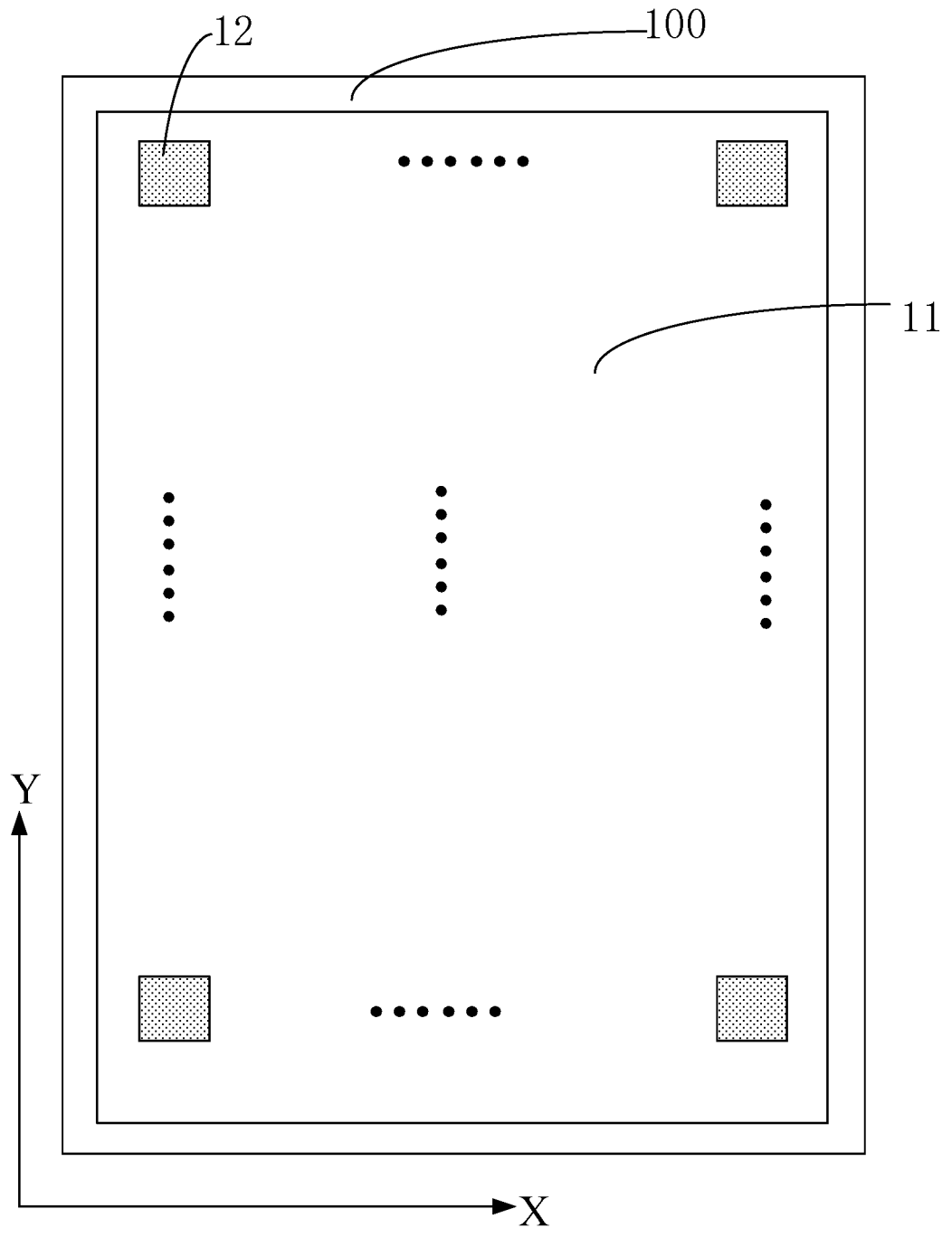
FIG. 1 is a schematic diagram of an exemplary display substrate according to an embodiment of the present disclosure.

FIG. 1 is a schematic diagram of an exemplary display substrate according to an embodiment of the present disclosure, as shown in FIG. 1, the display substrate 100 in the embodiment of the present disclosure includes a base substrate 11. On the base substrate 11, a plurality of pixel units 12 are disposed in a X direction and a Y direction, each pixel unit 12 includes a pixel driving circuit 121 and a light emitting device 122, and the pixel driving circuit 121 can drive the light emitting device 122 to emit light.

It should be noted that each pixel driving circuit 121 may drive the light emitting device 122 in one pixel unit 12, or may drive light emitting devices 122 in multiple pixel units 12, respectively, and in the present disclosure, it is described by taking a case where each pixel driving circuit 121 drives the light emitting device 122 in one pixel unit 12 as an example.

In some examples, the display substrate 100 may be applied to a display panel, such as an Active-matrix organic light Emitting Diode (AMOLED) display panel. The display substrate 100 may be an array substrate, and the pixel units 12 may be disposed on the base substrate 11 in a preset array, for example.

It should be noted that, a material of the base substrate 11 may be an organic material, for example, plastic; or an inorganic material, for example, glass. The light emitting device 122 may be a mini LED, an OLED, or an AMOLED, and the light emitting device 122 is configured to emit light under the driving of a driving current generated by the pixel driving circuit 121. In the present disclosure, the material of the base substrate 11 and a specific type of the light emitting device 122 are not limited.

Figure 2:
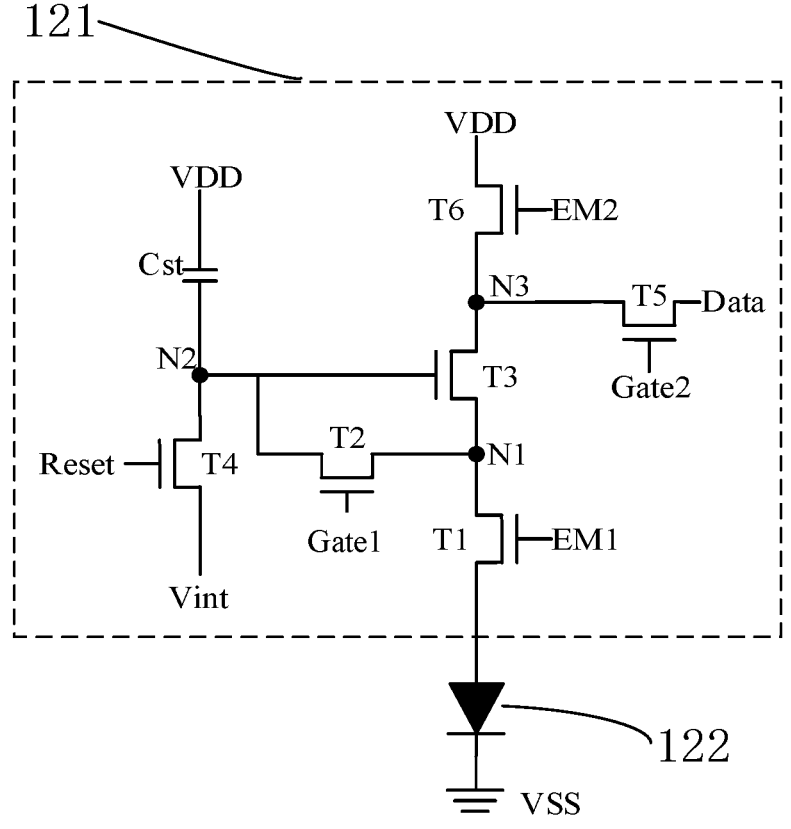
FIG. 2 is a schematic diagram of a pixel driving circuit according to an embodiment of the present disclosure.

FIG. 2 is a schematic diagram of a pixel driving circuit according to an embodiment of the present disclosure, and as shown in FIG. 2, the pixel driving circuit 121 includes: a first thin film transistor T1, a second thin film transistor T2, a third thin film transistor T3, a fourth thin film transistor T4, a fifth thin film transistor T5, a sixth thin film transistor T6, and a storage capacitor Cst.

Further, the first thin film transistor T1 serves as a first light-emitting control transistor in the pixel driving circuit 121, and has a gate connected to a first light-emitting control terminal EM1, a source connected to a first node N1, and a drain connected to an anode of the light emitting device 122. The second thin film transistor T2 serves as a compensation transistor in the pixel driving circuit 121, and has a gate connected to a first scan signal terminal Gate1, a drain connected to a second node N2, and a source connected to the first node N1. The third thin film transistor T3 serves as a driving transistor in the pixel driving circuit 121, and has a gate connected to the second node N2, a source connected to the first node N1, and a drain connected to a third node N3. The fourth thin film transistor T4 serves as a reset transistor in the pixel driving circuit 121, and has a gate connected to a reset signal terminal Reset, a source connected to an initialization signal terminal Vint, and a drain connected to the second node N2. The fifth thin film transistor T5 serves as a switching transistor in the pixel driving circuit 121, and has a gate connected to a second scan signal terminal Gate2, a source connected to a data signal terminal Data, and a drain connected to the third node N3. The sixth thin film transistor T6 serves as a second light-emitting control transistor in the pixel driving circuit 121, and has a gate connected to a second light-emitting control terminal EM2, a source connected to a first power signal terminal VDD, and a drain connected to the third node N3. The storage capacitor Cst has an electrode plate connected to the first power signal terminal VDD, and another electrode plate connected to the second node N2.

It should be noted that the thin film transistors may be classified into P-type transistors and N-type transistors, and the solutions of the present disclosure are described by taking the transistors in the present disclosure being N-type transistors, for example, NMOS transistors, as an example, that is, in the embodiment of the present disclosure, the first thin film transistor T1, the second thin film transistor T2, the third thin film transistor T3, the fourth thin film transistor T4, the fifth thin film transistor T5, and the sixth thin film transistor T6 are all N-type transistors. It should be understood that the thin film transistors of the embodiment of the present disclosure are not limited to N-type transistors, and any skilled in the art may also use P-type transistors, for example, PMOS transistors, as desired to implement the functions of one or more thin film transistors of the embodiment of the present disclosure.

In the embodiment of the present disclosure, a working process of the pixel driving circuit 121 includes: a reset stage S1, a data writing stage S2, and a light-emitting stage S3.

In the reset stage S1, a low level signal is input to the reset signal terminal Reset, the fourth thin film transistor T4 is turned on under the control of the low level signal, and the second node N2 and the gate of the third thin film transistor T3 are respectively reset by an initialization signal (a low level signal) input from the initialization signal terminal Vint, so that the second node N2 and the gate of the third thin film transistor T3 are restored to a lower potential, thereby preventing a high level data signal input at a previous frame of display picture from interfering with the second node N2 and the third thin film transistor T3 and affecting the accuracy of the data signal input currently.

In the data writing stage S2, a low level signal is input to the second scan signal terminal Gate2, the fifth thin film transistor T5 is turned on under the control of the low level signal, a data signal is written into the source of the third thin film transistor T3, and the storage capacitor Cst stores the data signal. Meanwhile, the second thin film transistor T2 is turned on under the control of a low level signal at the first scan signal terminal Gate1, the third thin film transistor T3 is turned on under the control of the data signal stored in the storage capacitor Cst, so that the gate and the drain of the third thin film transistor T3 are conducted (i.e., a current is allowed between the gate and the drain of the third thin film transistor T3), and the third thin film transistor T3 is in a self-saturation state, and in such case, the data signal and a threshold voltage of the third thin film transistor T3 are written to the second node N2, thereby compensating the threshold voltage of the third thin film transistor T3.

In the light emitting stage S3, a low level signal is input to the first light-emitting control signal terminal EM1 and the second light-emitting control signal terminal EM2, the first thin film transistor T1 and the sixth thin film transistor T6 are turned on under the control of the low level signal, and the third thin film transistor can convert a voltage at the first power signal terminal VDD into a driving current, so that a current loop is formed for the light emitting device 122 between the first power signal terminal VDD and the second power signal terminal VSS, and the light emitting device 122 is driven to emit light.

It should be noted that the pixel driving circuit may be of a 7T1C structure, a 7T2C structure, a 6T1C structure, a 6T2C structure, or a 9T2C structure, and the embodiment of the present disclosure is described by taking the pixel driving circuit being the 6T1C structure as an example. It should be understood that the circuit configuration may be changed by those skilled in the art according to actual situations.

With the increasing demand of users for display effect, improving the PPI of display devices is a problem to be solved in the field of display technology at present. In addition to achieving high PPI of the display device, the manufacturing process is also to be improved. In order to improve the PPI of the display device, part of elements in the pixel driving circuit are designed in a stacked manner to reduce a size of the pixel driving circuit, thereby reducing a size of the pixel unit. More pixel units can be arranged in the display substrate with a certain area, so that the PPI of the display device is improved. In the existing process, however, on one hand, most of the elements of the pixel driving circuit are electrically connected through connecting via holes, and part of the connecting via holes penetrate through almost all layer structures, so that the connecting via holes are too deep, and the yield is affected; on the other hand, most of the elements in the pixel driving circuit are electrically connected through the connecting via holes, so that difficulty and cost of the manufacturing process are high.

In view of above, an embodiment of the present disclosure provide a display substrate, which includes a base substrate and a plurality of pixel units disposed on the base substrate, where each of the pixel units includes a pixel driving circuit, and the structure of the pixel driving circuit can solve the foregoing problems.

The display substrate according to the embodiment of the present disclosure is described below with reference to the accompanying drawings and specific implementations.

Figure 3:
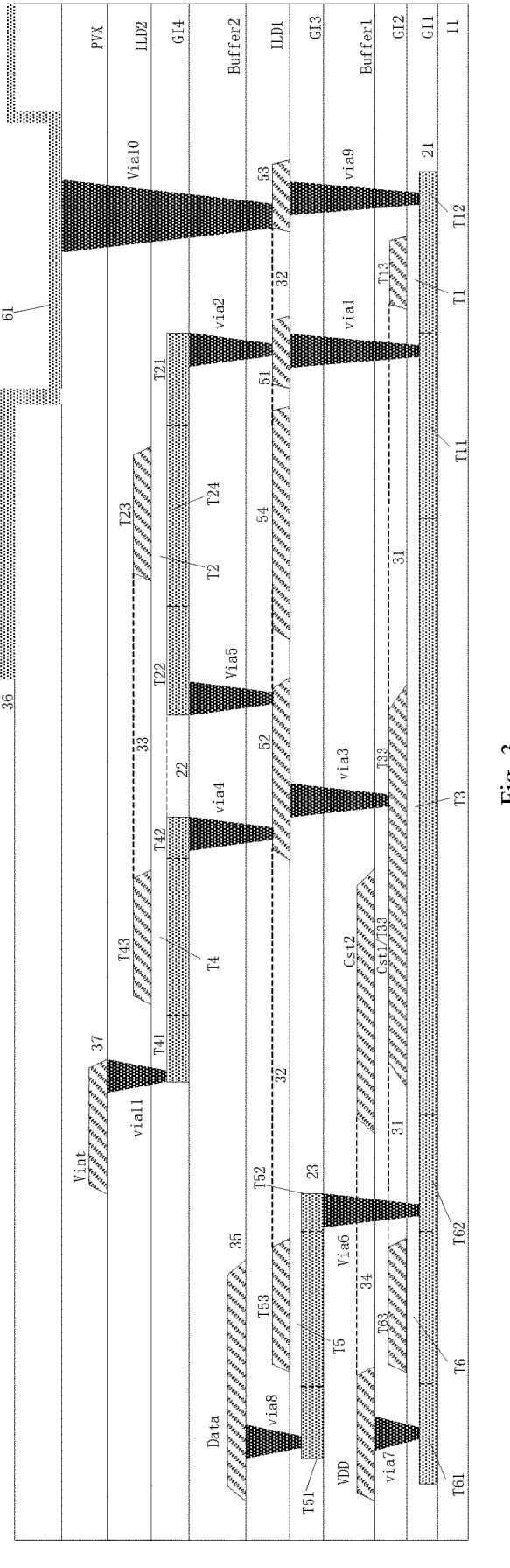
FIG. 3 is a schematic cross-sectional view of a display substrate according to an embodiment of the present disclosure.

The embodiment of the present disclosure provides a display substrate, and FIG. 3 is a schematic cross-sectional view of the display substrate provided in the embodiment of the present disclosure, as shown in FIG. 3, each pixel driving unit 121 includes a first thin film transistor T1, a second thin film transistor T2, a third thin film transistor T3, a fourth thin film transistor T4, a fifth thin film transistor T5, a sixth thin film transistor T6, a storage capacitor Cst, a first power signal terminal VDD, an initialization signal line Vint, and a data line Data. A plurality of layer structures are sequentially provided on the base substrate 11. Each thin film transistor includes a gate and an active layer including a source region, a drain region, and a channel region between the source region and the drain region. The active layers of the thin film transistors are located in semiconductor layers of the layer structures on the base substrate, and gates of the thin film transistors are respectively located in conductive layers of the layer structures on the base substrate. The first power signal terminal VDD, the initialization signal line Vint, the data line Data, and two electrode plates of the storage capacitor Cst are also in respective conductive layers of the layer structures on the base substrate 11. The display substrate further includes a gate insulating layer, an inter-layer insulating layer, a buffer layer and a passivation layer PVX disposed on the base substrate 11.

In some examples, the display substrate includes a first semiconductor layer 21, a first conductive layer 31, a second conductive layer 32, and a second semiconductor layer 22 sequentially disposed on the base substrate 11. The first semiconductor layer 21 includes a first active layer of the first thin film transistor T1, the first active layer including a first source region T11, a first drain region T12, and a first channel region sandwiched between the first source region T11 and the first drain region T12. The first conductive layer 31 includes a first gate T13 of the first thin film transistor T1. The second conductive layer 32 includes a first transfer electrode 51, and the first transfer electrode 51 is electrically connected to the first source region T11 through a first connecting via hole via1. The second semiconductor layer 22 includes a second active layer of the second thin film transistor T2, the second active layer including a second source region T21, a second drain region T22, and a second channel region T24 sandwiched between the second source region T21 and the second drain region T22; the second source region T21 is electrically connected with the first transfer electrode 51 through a second connecting via hole via2. The first thin film transistor T1 and the second thin film transistor T2 are electrically connected through the first transfer electrode 51 located in the second conductive layer 32, the source of the first thin film transistor T1 located in the first source region T11 is electrically connected to the first transfer electrode 51 through the first connecting via hole via1, and the source of the second thin film transistor T2 located in the second source region T21 is electrically connected to the first transfer electrode 51 through the second connecting via hole via2. The first connecting via hole via1 penetrates through a first gate insulating layer GI1, a second gate insulating layer GI2, a first buffer layer Buffer1, and a third gate insulating layer GI3 to be electrically connected to the first transfer electrode 51, and the second connecting via hole via2 penetrates through a second buffer layer Buffer2 and a first interlayer insulating layer ILD1 to be electrically connected to the first transfer electrode 51. The source of the first thin film transistor T1 and the source of the second thin film transistor T2 are electrically connected by upwardly overlapping the source of the first thin film transistor T1 to the first transfer electrode 51 and downwardly overlapping the source of the second thin film transistor T2 to the first transfer electrode 51.

It should be understood that no excessively deep connecting via hole is formed during downwardly overlapping the source of the second thin film transistor T2 to the first transfer electrode 51, and the first thin film transistor T1 and the second thin film transistor T2 are electrically connected through the first transfer electrode 51 by using two connecting via holes each penetrating through less layer structures instead of a connecting via hole penetrating through more layer structures. With the first transfer electrode, each connecting via hole is avoided to penetrate through too many layer structures, and the yield of the pixel units is improved.

Further, the first gate insulating layer GI1 is disposed on a side of the first semiconductor layer 21 away from the base substrate 11, and the first gate insulating layer GI1 can protect the first semiconductor layer 21. The second gate insulating layer GI2 is disposed on a side of the first conductive layer 31 away from the base substrate 11, and the second gate insulating layer GI2 can protect the first conductive layer 31. A fourth gate insulating layer GI4 is disposed on a side of the second semiconductor layer 22 away from the base substrate 11, and the fourth gate insulating layer GI4 can protect the second semiconductor layer 22. The first interlayer insulating layer ILD1 is disposed on a side of the second conductive layer 32 away from the base substrate 11, and the first interlayer insulating layer ILD1 can protect the second conductive layer 32.

It should be noted that, in the embodiment of the present disclosure, the materials of the first gate insulating layer GI1, the second gate insulating layer GI2, the fourth gate insulating layer GI4, and the first interlayer insulating layer ILD1 are not limited, and may be any materials that can achieve an insulating function.

In some examples, the pixel driving circuit further includes a third thin film transistor T3 and a fourth thin film transistor T4. The first semiconductor layer 21 further includes a third active layer of the third thin film transistor T3, the third active layer including a third source region, a third drain region, and a third channel region sandwiched between the third source region and the third drain region. The second conductive layer 32 further includes a second transfer electrode 52, and the second transfer electrode 52 is electrically connected to the third drain region through a third connecting via hole via3. The second semiconductor layer 22 further includes a fourth active layer of the fourth thin film transistor T4, the fourth active layer including a fourth source region T41, a fourth drain region T42 and a fourth channel region sandwiched between the fourth source region T41 and the fourth drain region T42, and the fourth drain region T42 is electrically connected to the second transfer electrode 52 through a fourth connecting via hole via4. The third thin film transistor T3 and the fourth thin film transistor T4 are electrically connected through the second transfer electrode 52 located in the second conductive layer 32, the source of the third thin film transistor T3 located in the third source region is electrically connected to the second transfer electrode 52 through the third connecting via hole via3, and the drain of the fourth thin film transistor T4 located in the fourth drain region T42 is electrically connected to the second transfer electrode 52 through the fourth connecting via hole via4. The third connecting via hole via3 penetrates through the third gate insulating layer GI3, the first buffer layer Buffer1 and the second gate insulating layer GI2, and the fourth connecting via hole via4 penetrates through the second buffer layer Buffer2 and the first interlayer insulating layer ILD1. The source of the third thin film transistor T3 and the drain of the fourth thin film transistor T4 are electrically connected by upwardly overlapping the source of the third thin film transistor T3 to the second transfer electrode 52 and downwardly overlapping the drain of the fourth thin film transistor T4 to the second transfer electrode 52.

It should be understood that no excessively deep connecting via hole is formed during downwardly overlapping the drain of the fourth thin film transistor T4 to the second transfer electrode 52, and the third thin film transistor T3 and the fourth thin film transistor T4 are electrically connected through the second transfer electrode 52 by using two connecting via holes each penetrating through less layer structures instead of a connecting via hole penetrating through too many layer structures. With the transfer electrode, each connecting via hole is avoided to penetrate through too many layer structures, and the yield of the pixel units is improved.

Further, an orthographic projection of the third active layer of the third thin film transistor T3 on the base substrate 11 is at least overlapped with an orthographic projection of the fourth active layer of the fourth thin film transistor T4 on the base substrate 11. The display substrate further includes a third conductive layer 33 disposed on a side of the second semiconductor layer 22, away from the base substrate 11, on the base substrate 11, and the third conductive layer 33 includes a fourth gate T43 of the fourth thin film transistor T4 and a second gate T23 of the second thin film transistor T2. Orthographic projections of a third gate T33 of the third transistor T3 and the fourth gate T43 on the base substrate 11 are also at least partially overlapped. By stacking the thin film transistors, an area of the pixel driving circuit is reduced, an area of the pixel unit is further reduced, more pixel units can be arranged on the display substrate with a certain area, and the PPI of the display device is improved.

In some examples, the second drain region T22 of the second thin film transistor T2 is electrically connected to the second transfer electrode 52 through a fifth connecting via hole via5. The second transfer electrode 52 is electrically connected to the third connecting via hole via3 and the fourth connecting via hole via4, with the second transfer electrode 52, the drain of the second thin film transistor T2 in the second drain region T22, the third gate T33 of the third thin film transistor T3 and the drain of the fourth thin film transistor T4 in the fourth drain region T42 are connected. The fifth connecting via hole via5 penetrates through the second buffer layer Buffer2 and the first interlayer insulating layer ILD1, and the second transfer electrode 52 serves as the second node N2 of the pixel driving circuit aforementioned.

In some examples, the pixel driving circuit further includes a fifth thin film transistor T5 and a sixth thin film transistor T6, and the display substrate further includes a third semiconductor layer 23 disposed between the first conductive layer 31 and the second conductive layer 32 on the base substrate 11. The first semiconductor layer 21 further includes a sixth active layer of the sixth thin film transistor T6, the sixth active layer including a sixth source region T61, a sixth drain region T62, and a sixth channel region sandwiched between the sixth source region T61 and the sixth drain region T62. The third semiconductor layer 23 includes a fifth active layer of the fifth thin film transistor T5, the fifth active layer including a fifth source region T51, a fifth drain region T52, and a fifth channel region sandwiched between the fifth source region T51 and the fifth drain region T52, and the fifth drain region T52 is electrically connected to the sixth drain region T62 through a sixth connecting via hole via6. The sixth connecting via hole via6 penetrates through the first buffer layer Buffer1, the second gate insulating layer GI2 and the first gate insulating layer GI1. The second conductive layer 32 further includes a fifth gate T53 of the fifth thin film transistor T5, the first conductive layer 31 further includes a sixth gate T63 of the sixth thin film transistor T6, and orthographic projections of the fifth gate T53 and the sixth gate T63 on the base substrate 11 are at least partially overlapped. By stacking the thin film transistors, an area of the pixel driving circuit is reduced, an area of the pixel unit is further reduced, more pixel units can be arranged on the display substrate with a certain area, and the PPI of the display device is improved.

Further, the third gate insulating layer GI3 is disposed on a side of the third semiconductor layer 23 away from the base substrate 11, and the third gate insulating layer GI3 can protect the third semiconductor layer 23.

It should be noted that, in the embodiment of the present disclosure, a material of the third gate insulating layer GI3 is not further limited, and may be any material that can achieve an insulating function.

In some examples, the pixel driving circuit further includes a storage capacitor Cst, the first conductive layer 31 further includes a first electrode plate Cst1 of the storage capacitor Cst, and the first electrode plate Cst1 is electrically connected to the third gate T33 of the third thin film transistor T3. The display substrate further includes a fourth conductive layer 34 disposed between the first conductive layer 31 and the third semiconductor layer 23 on the base substrate 11, the fourth conductive layer 34 including a second electrode plate Cst2 of the storage capacitor Cst and a first power signal terminal VDD. The first power signal terminal VDD is electrically connected to the sixth source region T61 of the sixth thin film transistor T6 through a seventh connecting via hole via7. The seventh connecting via hole via7 penetrates the first gate insulating layer GI1 and the second gate insulating layer GI2. In the manufacturing process, the first electrode plate Cst1 of the storage capacitor Cst and the third gate T33 of the third thin film transistor T3 may be formed into one piece, and during forming the second electrode plate Cst1 of the storage capacitor Cst, the first power signal terminal VDD is formed in the same layer as the second electrode plate Cst1 of the storage capacitor Cst, so that the number of process steps is reduced.

In some examples, the display substrate further includes a fifth conductive layer 35 disposed between the second semiconductor layer 22 and the second conductive layer 32 on the base substrate 11, the fifth conductive layer 35 including a data line Data. The data line Data is electrically connected to the fifth source region T51 of the fifth thin film transistor T5 through an eighth connecting via hole via8. The eighth connecting via hole via8 penetrates through the third gate insulating layer GI3 and the first interlayer insulating layer ILD1. Orthographic projections of the seventh connecting via hole via7 and the eighth connecting via hole via8 on the base substrate 11 are at least partially overlapped. By stacking the elements in the pixel driving circuit, an area of the pixel driving circuit is further reduced, an area of the pixel unit is further reduced, more pixel units can be arranged on the display substrate with a certain area, and the PPI of the display device is improved.

Further, a first buffer layer Buffer1 is disposed on a side of the fourth conductive layer 34 away from the base substrate 11, and a second buffer layer Buffer 2 is disposed on a side of the fifth conductive layer 35 away from the base substrate 11. The first buffer layer Buffer1 and the second buffer layer Buffer2 are usually made of an inorganic material, such as silicon oxide, silicon nitride, or the like to block moisture, oxygen and alkali ions, therefore, the first buffer layer Buffer1 and the second buffer layer Buffer2 have a relatively large hardness and a relatively large thickness.

It should be noted that specific materials of the first buffer layer Buffer1 and the second buffer layer Buffer2 are not limited in the present disclosure.

In some examples, the pixel unit further includes a light emitting device, the display substrate further includes a sixth conductive layer 36 disposed on a side of the second semiconductor layer 22, away from the base substrate 11, on the base substrate 11, the sixth conductive layer 36 including a first electrode 61 of the light emitting device. The second conductive layer 32 further includes a third transfer electrode 53, and the first electrode 61 of the light emitting device is electrically connected to the third transfer electrode 53 through a ninth connecting via hole via9. The third transfer electrode 53 is electrically connected to the drain of the first thin film transistor T1 in the first drain region T12 through a tenth connecting via hole via10. The ninth connecting via hole via9 penetrates through the passivation layer PVX, the second interlayer insulating layer ILD2, the fourth gate insulating layer GI4, the second buffer layer Buffer2 and the first interlayer insulating layer ILD1, and the tenth connecting via hole via10 penetrates through the third gate insulating layer GI3, the first buffer layer Buffer1, the second gate insulating layer GI2 and the first gate insulating layer GI1. It should be understood that in a case where the first electrode 61 of the light emitting device is directly connected to the drain, in the first drain region T12, of the first thin film transistor T1 located at the bottom through a connecting via hole, the connecting via hole is desired to penetrate almost all layer structures, resulting in an excessively long via hole, thereby affecting yield. With the transferring of the third transfer electrode, the connecting via hole penetrating through more layer structures is replaced by using two connecting via holes each penetrating through less layer structures, thus the yield of the pixel units is improved.

It should be noted that, during the first transfer electrode 51, the second transfer electrode 52, the third transfer electrode 53, and a first light-shielding metal being formed in the second conductive layer 32, the fifth gate T53 of the fifth thin film transistor T5 may be formed simultaneously. In the manufacturing process, only one mask is used to form the first transfer electrode 51, the second transfer electrode 52, the third transfer electrode 53, the first light-shielding metal, and the fifth gate T53 of the fifth thin film transistor T5. With such method, the number of process steps and production cost are reduced.

In some examples, the display substrate further includes a seventh conductive layer 37 disposed between the second semiconductor layer 22 and the sixth conductive layer 36 on the base substrate 11. The seventh conductive layer 37 includes an initialization signal line Vint electrically connected to the fourth source region T41 of the fourth thin film transistor T4 through an eleventh connecting via hole via11. The eleventh connecting via hole via11 penetrates through the second interlayer insulating layer ILD2 and the fourth gate insulating layer GI4. A passivation layer PVX is provided on a side of the seventh conductive layer 37 away from the base substrate 11, and protects the seventh conductive layer 37. It should be noted that a material of the passivation layer PVX may be the same as the material of the gate insulating layer and the interlayer insulating layer, or may be another insulating material. In the present disclosure, the passivation layer PVX is not further limited.

In some examples, the second conductive layer 32 further includes a first light-shielding pattern 54, and an orthogonal projection of the first light-shielding pattern 54 on the base substrate 11 covers an orthogonal projection of the second channel region T24 of the second thin film transistor T2 on the base substrate 11. The first light-shielding pattern 54 is configured to shield light reflected from the base substrate 11 to ensure that the second channel region T24 of the second thin film transistor T2 is not affected by the light, so that the second thin film transistor T2 can operate normally.

Figure 4:
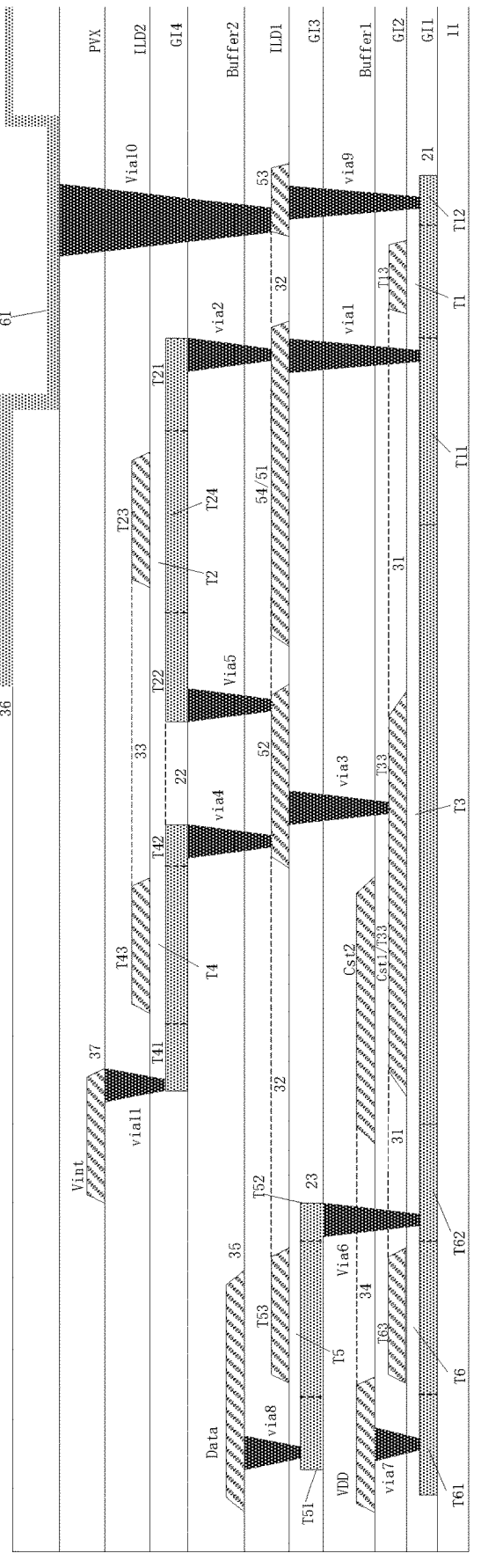
FIG. 4 is a schematic cross-sectional view of a display substrate according to an embodiment of the present disclosure.

Further, FIG. 4 is a schematic cross-sectional view of another display substrate provided in the embodiment of the present disclosure, and as shown in FIG. 4, the first light-shielding pattern 54 and the first transfer electrode 51 are connected into an integral structure. The first light-shielding pattern 54 and the first transfer electrode 51 may be formed into one piece during the manufacturing process, thereby reducing the process steps.

In view of the above display substrate, an embodiment of the present disclosure provide a method for manufacturing the display substrate, the method includes steps S1 to S20.

At step S1, forming a first semiconductor layer 21 on a base substrate 11.

Specifically, a semiconductor layer is first deposited on the base substrate 11, and then a photoresist is coated on a side of the semiconductor layer away from the base substrate 11, and processes of exposure, development, etching, stripping and the like are performed thereon to obtain the first semiconductor layer 21, that is, a first active layer of a first thin film transistor T1, a third active layer of a third thin film transistor T3 and a sixth active layer of a sixth thin film transistor T6 are obtained.

Further, in order to reduce process difficulty and improve working efficiency, and further in order to reduce an area occupied by the active layers of the thin film transistors, the first active layer of the first thin film transistor T1, the third active layer of the third thin film transistor T3, and the sixth active layer of the sixth thin film transistor T6 may be connected as an integrated structure (e.g., connected into one piece).

It should be noted that the semiconductor layer is deposited on the base substrate 11, and the semiconductor layer may be deposited on the base substrate 11 by a Chemical Vapor Deposition (CVD) method or an Atomic Layer Deposition (ALD) method.

At step S2, forming a first gate insulating layer GI1 on a side of the first semiconductor layer 21 away from the base substrate 11.

Specifically, the first gate insulating layer GI1 is deposited on the side of the first semiconductor layer 21 away from the base substrate 11.

The preparation method related to deposition in the embodiment of the present disclosure may be the preparation method of depositing the first semiconductor layer 21, and repeated description thereof is omitted.

At step S3, forming a first conductive layer 31 on a side of the first gate insulating layer GI1 away from the base substrate 11.

Specifically, firstly, a conductive layer is deposited on a side of the first gate insulating layer GI1 away from the base substrate 11; then, a photoresist is coated on a side of the conductive layer away from the base substrate 11, and processes of exposure, development, etching, and stripping are performed at preset positions of the conductive layer to obtain the first conductive layer 31, that is, a first gate T13 of the first thin film transistor T1, a third gate T33 of the third thin film transistor T3, a sixth gate T63 of the sixth thin film transistor T6, and a first electrode plate Cst1 of a storage capacitor Cst are obtained.

At step S4, doping the first semiconductor layer 21 by using the first conductive layer 31 as a mask.

Illustratively, by using the first conductive layer 31 as a mask, the first semiconductor layer 21 is heavily doped, with the impurities being N-type impurities (i.e., phosphorus ions), and in a case where phosphorus ions are doped in both a source region and a drain region of the active region in each of the first thin film transistor T1, the third thin film transistor T3 and the sixth thin film transistor T6, the conductivity of the source region and the drain region can be respectively improved, that is, the conductivity of a source and a drain of each of the first thin film transistor T1, the third thin film transistor T3 and the sixth thin film transistor T6 is respectively improved.

At step S5, depositing a second gate insulating layer GI2 on a side of the first conductive layer 31 away from the base substrate 11.

At step S6, forming a fourth conductive layer 34, i.e., including a first power signal terminal VDD and a second electrode plate Cst2 of the storage capacitor Cst, on a side of the second gate insulating layer GI2 away from the base substrate 11. A seventh connecting via hole via7 penetrating through the first gate insulating layer GI1 and the second gate insulating layer GI2 is formed, so that the first power signal terminal VDD and the source of the sixth active layer of the sixth thin film transistor T6 are electrically connected.

At step S7, depositing a first buffer layer Buffer1 on a side of the fourth conductive layer 34 away from the base substrate 11.

At step S8, depositing a third semiconductor layer 23 on a side of the first buffer layer Buffer1 away from the base substrate 11, forming a sixth via hole via6 penetrating through the first buffer layer Buffer1, the second gate insulating layer GI2 and the first gate insulating layer GI1, where a drain region of a fifth active layer of a fifth thin film transistor T5 in the third semiconductor layer 23 is electrically connected to a drain region of a sixth active layer of the sixth thin film transistor T6 in the first semiconductor layer 21 through the sixth via hole via 6.

At step S9, depositing a third gate insulating layer GI3 on a side of the third semiconductor layer 23 away from the base substrate 11.

At step S10, depositing a second conductive layer 32 on a side of the third gate insulating layer GI3 away from the base substrate 11.

Specifically, a fifth gate T53 of the fifth thin film transistor T5, a first transfer electrode 51, a second transfer electrode 52, a third transfer electrode 53, and a first light-shielding pattern 54 are deposited by using one mask. A third connecting via hole via3 penetrating through the third gate insulating layer GI3, the first buffer layer Buffer1 and the second gate insulating layer GI2 is formed, and a first connecting via hole via1 and a ninth connecting via hole via9 penetrating through the third gate insulating layer GI3, the first buffer layer Buffer1, the second gate insulating layer GI2 and the first gate insulating layer GI 1 are formed.

At step S11, depositing a first interlayer insulating layer ILD1 on a side of the second conductive layer 32 away from the base substrate 11.

Illustratively, the first interlayer insulating layer ILD1 may include, for example, a silicon compound or a metal oxide, and the like.

At step S12, depositing a fifth conductive layer 35 on a side of the first interlayer insulating layer ILD1 away from the base substrate 11.

The fifth conductive layer 35 includes a data line Data. The data line Data is electrically connected to a source of a fourth active layer of a fourth thin film transistor T4 through an eighth connecting via hole via8, and the eighth connecting via hole via8 penetrates through the first interlayer insulating layer ILD1 and the third gate insulating layer GI3.

At step S13, depositing a second buffer layer Buffer2 on a side of the fifth conductive layer 35 away from the base substrate 11.

The second buffer layer Buffer2 may be a buffer layer made of the same material as the first buffer layer Buffer 1; alternatively, the second buffer layer Buffer2 may be made of other materials, which may be selected according to practical application scenarios or experiences, or as desired, and are not limited in particular in the embodiments of the present disclosure.

At step S14, depositing a second semiconductor layer 22 on a side of the second buffer layer Buffer2 away from the base substrate 11.

The second semiconductor layer 22 includes a second active layer of the second thin film transistor T2 and a fourth active layer of the fourth thin film transistor T4. The second thin film transistor T2 is electrically connected to the first transfer electrode 51 and the second transfer electrode 52 through a second connecting via hole via2 and a fifth connecting via hole via5, respectively, and the fourth thin film transistor T4 is electrically connected to the second transfer electrode 52 through a fourth connecting via hole via4. The second connecting via hole via2, the fifth connecting via hole via5, and the fourth connecting via hole via4 penetrate through the second buffer layer Buffer2 and the first interlayer insulating layer.

First, an oxide semiconductor layer is deposited, and the second channel region T24 of the second active layer of the second thin film transistor T2 and the fourth channel region of the fourth active layer of the fourth thin film transistor T4 are made of Indium Gallium Zinc Oxide (IGZO). Then the second semiconductor layer 22 is doped by using the third conductive layer 33 as a mask to make source regions and drain regions in the second active layer and the fourth active layer become conductors.

Illustratively, by using the third conductive layer 33 as a mask, the third semiconductor layer 23 is heavily doped, with the impurities being N-type impurities (i.e., phosphorus ions), and in a case that phosphorus ions are doped in both the source regions and the drain regions, the conductivity of the source regions and the drain regions of the active regions in the driving transistor T4 and the light-emitting control transistor T5 can be improved, that is, the conductivity of the sources and the drains of the driving transistor T4 and the light-emitting control transistor T5 can be improved.

At step S15, depositing a fourth gate insulating layer GI4 on a side of the third conductive layer 33 away from the base substrate 11.

At step S16, depositing a third conductive layer 33 on a side of the third gate insulating layer GI3.

The third conductive layer 33 includes a second gate T23 of the second thin film transistor T2 and a fourth gate T43 of the fourth thin film transistor T4.

At step S17, forming a second interlayer insulating layer ILD2 on a side of the third conductive layer 33 away from the base substrate 11.

At step S18, depositing a seventh conductive layer 37 on a side of the second interlayer insulating layer ILD2 away from the base substrate 11.

The seventh conductive layer 37 includes an initialization signal terminal connected to the source of the fourth active layer of the fourth thin film transistor T4 through an eleventh connecting via hole via11. The eleventh connecting via hole via11 penetrates through the second interlayer insulating layer ILD2 and the fourth gate insulating layer GI4.

At step S19, forming a passivation layer PVX on a side of the seventh conductive layer 37 away from the base substrate 11.

At step S20, forming a sixth conductive layer 36 on a side of the passivation layer PVX away from the base substrate 11.

The sixth conductive layer 36 includes a first electrode 61 of the light emitting device, and the first electrode 61 is electrically connected to the third transfer electrode 53 in the second conductive layer 32 through a tenth connecting via hole via10. Therefore, the first electrode 61 of the light emitting device is electrically connected to the drain of the first active layer of the first thin film transistor T1.

In the above method for manufacturing the display substrate, the pixel driving circuit of the pixel unit is formed on the base substrate 11, where a connecting via hole penetrating through more layer structures is replaced by two connecting via holes each penetrating through less layer structures. The two connecting via holes, each penetrating through less layer structures, being electrically connected by the transfer electrode is equivalent to one connecting via hole penetrating through more layer structures. In this way, the via hole is avoided to penetrate through more layer structures to affect the yield of the pixel units.

Herein, for a specific structure of the display substrate in the method for forming the display substrate, reference may be made to the structure of the display substrate in the foregoing embodiment of the display substrate, and details thereof are not repeated here.

In some implementations, the active layer of the thin film transistor includes a source region, a drain region, and a channel region sandwiched between the source region and the drain region. The source region serves as the source of the thin film transistor, and the drain region serves as the drain of the thin film transistor.

An embodiment of the present disclosure further provides a display device, which includes the display substrate described above.

In the display device adopting the display substrate described above, by stacking the elements of the pixel driving circuit, an area of the pixel driving circuit is reduced, and an area of the pixel unit is reduced, so that more pixel units can be arranged in the display device with a certain area, and the PPI of the display device is improved. In addition to that the process flow is shortened and the process cost is reduced, replacing the connecting via hole, penetrating through more layer structures, that may affect the yield of the pixels by using the two connecting via holes each penetrating through less layer structures can improve the quality of the display device.

It will be understood that the above embodiments are merely exemplary embodiments adopted to illustrate the principles of the present disclosure, and the present disclosure is not limited thereto. It will be apparent to those skilled in the art that various modifications and improvements can be made without departing from the spirit and scope of the present disclosure, and such modifications and improvements are also considered to be within the scope of the present disclosure.

What is claimed is:

1. A display substrate, comprising a base substrate and a plurality of pixel units disposed on the base substrate, each pixel unit comprises a pixel driving circuit, and the pixel driving circuit at least comprises a first thin film transistor and a second thin film transistor;

the display substrate further comprises a first semiconductor layer, a first conductive layer, a second conductive layer and a second semiconductor layer sequentially arranged on the base substrate, wherein the first semiconductor layer comprises a first active layer of the first thin film transistor, the first active layer comprising a first source region, a first drain region and a first channel region sandwiched between the first source region and the first drain region;

the first conductive layer comprises a first gate of the first thin film transistor;

the second conductive layer comprises a first transfer electrode electrically connected with the first source region through a first connecting via hole; and the second semiconductor layer comprises a second active layer of the second thin film transistor, the second active layer comprising a second source region, a second drain region and a second channel region sandwiched between the second source region and the second drain region, and the second source region being electrically connected with the first transfer electrode through a second connecting via hole, and wherein the pixel driving circuit further comprises a third thin film transistor and a fourth thin film transistor, the first semiconductor layer further comprises a third active layer of the third thin film transistor, the third active layer comprising a third source region, a third drain region and a third channel region sandwiched between the third source region and the third drain region;

the second conductive layer further comprises a second transfer electrode electrically connected with the third drain region through a third connecting via hole;

the second semiconductor layer further comprises a fourth active layer of the fourth thin film transistor, the fourth active layer comprising a fourth source region, a fourth drain region and a fourth channel region sandwiched between the fourth source region and the fourth drain region, and the fourth drain region being electrically connected to the second transfer electrode through a fourth connecting via hole, and wherein the second drain region is electrically connected to the second transfer electrode through a fifth connecting via hole.

2. The display substrate of claim 1, wherein orthographic projection of the third active layer and the fourth active layer on the base substrate are at least partially overlapped.

3. A display device, comprising the display substrate of claim 2.

4. The display substrate of claim 2, further comprising a third conductive layer located on a side of the second semiconductor layer away from the base substrate, wherein the third conductive layer comprises a fourth gate of the fourth thin film transistor and a second gate of the second thin film transistor.

5. A display device, comprising the display substrate of claim 4.

6. The display substrate of claim 1, wherein the pixel driving circuit further comprises a storage capacitor, and the first conductive layer further comprises a first electrode plate of the storage capacitor, the first electrode plate being electrically connected to a third gate of the third thin film transistor.

7. The display substrate of claim 1, wherein the pixel unit further comprises a light emitting device, the display substrate further comprises a sixth conductive layer located on a side of the second semiconductor layer away from the base substrate, the sixth conductive layer comprising a first electrode of the light emitting device, the second conductive layer further comprises a third transfer electrode, the first electrode is electrically connected to the third transfer electrode through a ninth connecting via hole, and the third transfer electrode is electrically connected to the first drain region of the first thin film transistor through a tenth connecting via hole.

8. The display substrate of claim 7, further comprising a seventh conductive layer between the second semiconductor layer and the sixth conductive layer, the seventh conductive layer comprising an initialization signal line electrically connected to the fourth source region of the fourth thin film transistor through an eleventh connecting via hole.

9. A display device, comprising the display substrate of claim 1.

10. A display substrate, comprising a base substrate and a plurality of pixel units disposed on the base substrate, each pixel unit comprises a pixel driving circuit, and the pixel driving circuit at least comprises a first thin film transistor and a second thin film transistor;

the display substrate further comprises a first semiconductor layer, a first conductive layer, a second conductive layer and a second semiconductor layer sequentially arranged on the base substrate, wherein the first semiconductor layer comprises a first active layer of the first thin film transistor, the first active layer comprising a first source region, a first drain region and a first channel region sandwiched between the first source region and the first drain region;

the first conductive layer comprises a first gate of the first thin film transistor;

the second conductive layer comprises a first transfer electrode electrically connected with the first source region through a first connecting via hole; and the second semiconductor layer comprises a second active layer of the second thin film transistor, the second active layer comprising a second source region, a second drain region and a second channel region sandwiched between the second source region and the second drain region, and the second source region being electrically connected with the first transfer electrode through a second connecting via hole, and wherein the pixel driving circuit further comprises a fifth thin film transistor and a sixth thin film transistor;

the display substrate further comprises a third semiconductor layer between the first conductive layer and the second conductive layer;

the first semiconductor layer further comprises a sixth active layer of the sixth thin film transistor, the sixth active layer comprising a sixth source region, a sixth drain region and a sixth channel region sandwiched between the sixth source region and the sixth drain region;

the third semiconductor layer comprises a fifth active layer of the fifth thin film transistor, the fifth active layer comprising a fifth source region, a fifth drain region and a fifth channel region sandwiched between the fifth source region and the sixth drain region, and the fifth drain region being electrically connected to the sixth drain region through a sixth connecting via hole.

11. The display substrate of claim 10, wherein the second conductive layer further comprises a fifth gate of the fifth thin film transistor; and the first conductive layer further comprises a sixth gate of the sixth thin film transistor, and orthographic projections of the fifth gate and the sixth gate on the base substrate are at least partially overlapped.

12. The display substrate of claim 10, further comprising a fourth conductive layer between the first conductive layer and the third semiconductor layer, the fourth conductive layer comprising a second electrode plate of the storage capacitor and a first power signal terminal, and the first power signal terminal being electrically connected to the sixth source region of the sixth thin film transistor through a seventh connecting via hole.

13. The display substrate of claim 12, further comprising a fifth conductive layer between the second semiconductor layer and the second conductive layer, the fifth conductive layer comprising a data line, and the data line being electrically connected to the fifth source region of the fifth thin film transistor through an eighth connecting via hole.

14. The display substrate of claim 13, wherein orthographic projections of the seventh connecting via hole and the eighth connecting via hole on the base substrate are at least partially overlapped.

15. A display substrate, comprising a base substrate and a plurality of pixel units disposed on the base substrate, each pixel unit comprises a pixel driving circuit, and the pixel driving circuit at least comprises a first thin film transistor and a second thin film transistor;

the display substrate further comprises a first semiconductor layer, a first conductive layer, a second conductive layer and a second semiconductor layer sequentially arranged on the base substrate, wherein the first semiconductor layer comprises a first active layer of the first thin film transistor, the first active layer comprising a first source region, a first drain region and a first channel region sandwiched between the first source region and the first drain region;

the first conductive layer comprises a first gate of the first thin film transistor;

the second conductive layer comprises a first transfer electrode electrically connected with the first source region through a first connecting via hole; and the second semiconductor layer comprises a second active layer of the second thin film transistor, the second active layer comprising a second source region, a second drain region and a second channel region sandwiched between the second source region and the second drain region, and the second source region being electrically connected with the first transfer electrode through a second connecting via hole, and wherein the second conductive layer further comprises a first light-shielding pattern, and an orthographic projection of the first light-shielding pattern on the base substrate covers an orthographic projection of the second channel region on the base substrate.

16. The display substrate of claim 15, wherein the first light-shielding pattern and the first transfer electrode are connected into one piece.

* * * * *